(12) United States Patent
Lin et al.

(10) Patent No.: US 8,847,350 B2
(45) Date of Patent: Sep. 30, 2014

(54) METAL-VIA FUSE

(75) Inventors: Sung-Chieh Lin, Zhubei (TW);
Kuoyuan (Peter) Hsu, San Jose, CA (US); Wei-Li Liao, Taichung (TW);
Yun-Han Chen, Chiayi (TW);
Chen-Ming Hung, Zhubei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/599,654

(22) Filed: Aug. 30, 2012

(65) Prior Publication Data

US 2014/0061851 A1    Mar. 6, 2014

(51) Int. Cl.
*H01L 23/52*    (2006.01)

(52) U.S. Cl.
USPC ............... 257/529; 257/E23.149; 257/539; 257/E21.529

(58) Field of Classification Search
USPC ................ 257/539, E23.149, E21.529
See application file for complete search history.

(56) References Cited

U.S. PATENT DOCUMENTS

| 5,589,706 | A  | * | 12/1996 | Mitwalsky et al. | 257/529 |
| 6,608,498 | B2 | * | 8/2003  | Khoury           | 324/762.01 |
| 2002/0191467 | A1 | * | 12/2002 | Matsumoto et al. | 365/222 |
| 2010/0252908 | A1 | * | 10/2010 | Schlarmann       | 257/529 |
| 2011/0006392 | A1 | * | 1/2011  | Kono et al.      | 257/529 |
| 2012/0154102 | A1 | * | 6/2012  | Chen             | 337/290 |

* cited by examiner

*Primary Examiner* — Mamadou Diallo
(74) *Attorney, Agent, or Firm* — Lowe Hauptman & Ham, LLP (57) ABSTRACT

The embodiments of methods and structures disclosed herein provide mechanisms of forming and programming a metal-via fuse. The metal-via fuse and a programming transistor form a one-time programmable (OTP) memory cell. The metal-via fuse has a high resistance and can be programmed with a low programming voltage, which expands the programming window.

20 Claims, 7 Drawing Sheets

METAL-VIA FUSE

FIELD

The present disclosure relates to an electrical fuse. Particularly, the disclosure relates to a fuse involving both metal line and via plug(s).

BACKGROUND

In the semiconductor industry, fuse elements are widely used in integrated circuits for a variety of purposes. A fuse disconnected by passing an electrical current, or blowing, is referred to as an electrical fuse, or e-fuse. By selectively blowing fuses within an integrated circuit, which has multiple potential uses, a generic integrated circuit design may be economically manufactured and adapted to a variety of customer uses.

Fuses are incorporated in the design of the integrated circuits, and are selectively blown, for example, by passing an electrical current of a sufficient magnitude to cause melting or agglomeration, thereby creating a more resistive path or an open circuit. The process of selectively blowing fuses is referred to as "programming."

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following description provides many different embodiments, or examples, for implementing different features of the disclosure. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
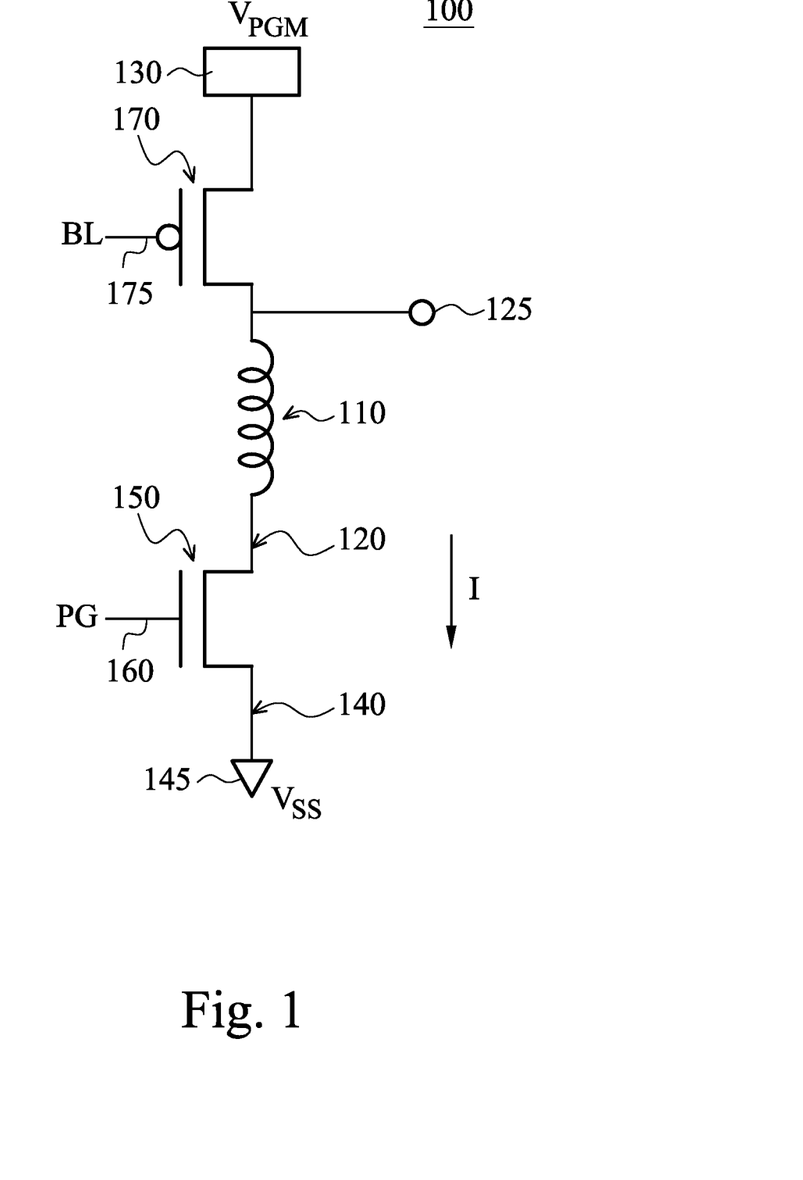
FIG. 1 is a circuit diagram of a one-time programmable (OTP) memory cell, in accordance with some embodiments.

FIG. 1 is a circuit diagram of a one-time programmable (OTP) memory cell 100, in accordance with some embodiments. The OTP memory cell 100 has a fuse 110, which can be a metal fuse or a polysilicon fuse. A polysilicon fuse may be made of salicided or non-salicided polysilicon. The fuse 110 is between a drain 120 of a programming transistor 150 and a voltage source 130, which supplies a programming voltage, $V_{PGM}$. Access to the voltage source 130 is controlled by a controlling transistor 170, in accordance with some embodiments. Alternatively, the controlling transistor 170 is omitted. In some embodiments, the programming voltage is the supply voltage. The source 140 of the programming transistor 150 is connected to a ground 145 (or $V_{SS}$). In addition, a read node (RN) 125 is between the fuse 110 and the controlling transistor 170. Before fuse 110 is programmed (closed fuse 110), the resistance of the fuse 110 is at the resistance of the conductive material used to make fuse 110 and is relatively low in comparison to the resistivity after fuse 110 is blown. As a result, RN 125 can read a voltage, which is a relatively low. The OTP memory cell 100 is considered to store a low logic level (a Low).

The fuse is programmed by switching ON the controlling transistor 170. The controlling transistor 170 may be switched on (or turned on) by applying a signal BL at gate 175 to allow fuse 110 to connect to the voltage source 130. In embodiments where controlling transistor 170 is a p-type metal oxide semiconductor (PMOS) transistor, the signal BL is a zero volt signal. The programming transistor 150 is also switched on by applying a signal PG at the gate 160. The signal PG applied is a voltage, a gate to source voltage $V_{GS}$, capable of turning on transistor 150. When the transistor 150 is turned ON, a current I flows from voltage source 130 via transistor 170, first to the drain 120 of transistor 150 and then to the source 140 of transistor 150. Current I causes fuse 110 to heat up and blows fuse 110. Fuse 110 is "blown" by melting, agglomeration, or other mechanisms. When a metal or polysilicon fuse is blown, the fuse become discontinuous and the resistance of the fuse increases. Therefore, after fuse 110 is blown, fuse 110 has a much higher resistance than before it is blown. With the fuse blown, the OTP memory cell 100 is considered being programmed. After memory cell 100 is programmed, the voltage read by RN 125 is high due to high resistance of the fuse 110. Therefore, the OTP memory cell 100 is considered to store a high logic level (a High).

Figure 2A:
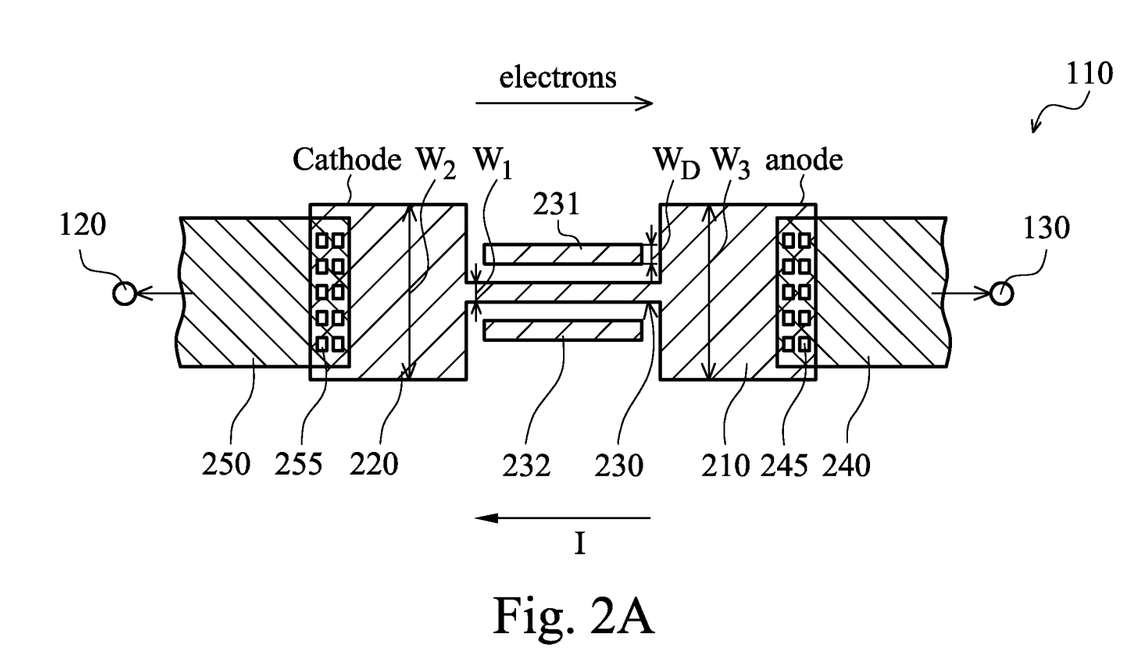
FIG. 2A is a top view of the electrical fuse, in accordance with some embodiments.

FIG. 2A is a top view of the electrical fuse 110, in accordance with some embodiments. Electrical fuse (or e-fuse) 110 has an anode 210 and a cathode 220. The Anode 210 and the cathode 220 are connected by a fuse link 230. The anode 210, the cathode 220, and the fuse link 230 may be made of a conductive material, such as metal, poly-silicide, or polysilicon, in accordance with some embodiments. Examples of metals that could be used to form e-fuse include, but are not limited to, Al, Al-alloy, Cu, Cu-alloy, etc. Examples of poly-silicides used to form e-fuse include, but are not limited to, $CoSi_2$ (cobalt silicide), NiSi (nickel silicide), etc. FIG. 2A shows that there are two dummy metal lines, 231 and 232, next to fuse link 230. Dummy metal lines 231 and 232 are formed to improve an accuracy of patterning a width $W_1$ of fuse link 230. The width $W_1$ of fuse link 230 could become inaccurate due to light reflection and refraction during a lithographical process. Dummy metal lines, such as lines 231 and 232, can be used to improve the patterning accuracy. In some embodiments, a width $W_{1D}$ of the dummy metal line, 231 or 232, is about equal to the width $W_1$ of fuse link 230. However, in some embodiments, the width $W_D$ of the dummy metal line, 231 or 232, is not equal to the width $W_1$ of fuse link 230 and can be wider than the width $W_1$ of the fuse link 230.

Anode 210 is connected to an upper conductive layer 240 by contacts or vias (or contacts/vias) 245, in accordance with some embodiments. The upper conductive layer 240 is connected to the voltage source 130, which could supply the programming voltage, $V_{PGM}$. Cathode 220 is connected to an upper conductive layer 250 by contacts or vias (or contacts/vias) 255. The conductive layer 250 is connected to the drain 120, of the programming transistor 150 of FIG. 1. Alternatively, the cathode 220 can be connected to the drain 120 directly without the upper conductive layer 250 and the contacts/vias 255. The upper conductive layer 240 and the upper conductive layer 250 can be made of metal. The cathode 220 and the anode 210 are connected to each other via a fuse link 230. The fuse link 230 has the width $W_1$, which is smaller than a width $W_2$ of cathode 220 or a width $W_3$ of anode 210. Width $W_2$ may be larger or smaller than width $W_3$. $W_2$ may also be about the same as $W_3$.

Fuse link 230 is narrower than anode 210 or cathode 220 and has a resistance, R, higher than the resistance of either the wider anode 210 or the wider cathode 220. When the programming transistor 150 is turned ON, a current, I, flows from anode 210 to cathode 220 with the application of a $V_{PGM}$ at voltage source 130 (via the conductive layer 240), as shown in FIG. 2A. Electrons flow in an opposite direction of the current I. Due to the resistance of the fuse link 230, the fuse link 230 is heated due to the Joule effect. Equation (1) shows Joule's first law.

$$Q=I^2Rt=V^2/Rt \qquad (1)$$

Figure 2B:
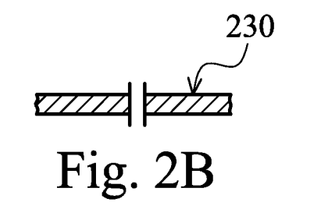
FIG. 2B is a top view of a blown fuse link, in accordance with some embodiments.

Q represents the heat generated and t is the time passed. The heat generated in the fuse link 230 increases the temperature of the fuse link 230, which is enclosed by dielectric layers. If the temperature of the fuse link 230 becomes high enough, the fuse link 230 may melt, which could result in a discontinuous fuse link 230 with increased resistance. As mentioned above, the increased resistance of the melted fuse link 230 could indicate that the e-fuse 110 has been programmed. FIG. 2B is a top view of a blown fuse link 230, in accordance with some embodiments. The melting of the fuse link 230 results in a discontinuous fuse link 230, which has a higher resistance compared to before the fuse link 230 is blown.

As mentioned above, the fuse link 230 may be made of a conductive material, such as metal, poly-silicide, or polysilicon. Due to the lowering of the applied current (I) to blow fuse link 230 for advanced technology node, the resistivity (R) of the fuse link 230 needs to be higher to generate sufficient heat (Q) to burn (or break) the fuse link 230. A fuse link made of polycide has been used in advanced technology nodes because the polycide fuse link can be programmed by electromigration mode, instead of rupture mode for metal or other types of fuses. However, some advanced technologies use replacement gate processing technology to form gate structures. For replacement gate technology, a polysilicon gate is replaced with a metal gate. As a result, polycide is no longer available for forming a polycide-fuse in accordance with some embodiments.

One alternative is to use a metal-fuse formed by metal lines of interconnect. However, metal lines made of copper have lower resistivity. To blow a metal fuse made of copper, the current I needed is equal to or greater than about 25 mA, in accordance with some embodiments. For advanced technologies, the current for blowing the fuse is relatively low, such as 10 mA. In some embodiments, the current for blowing the fuse is in a range from about 10 mA to about 20 mA. In some embodiments, the programming voltage $V_{PGM}$ is in a range from about 1.2V to about 2.4V. The fuse link of the metal-fuse would have to be quite narrow to have sufficiently high resistivity to enable blowing the metal-fuse. The requirement of narrow metal fuse link cannot be met for metal fuse links built at metal level higher than first metal layer (M1), such as M2, M3, and higher metal layers, in some embodiments. However, using M1 to make metal fuse link is sometimes not desirable due to the vicinity of the metal fuse link to the gate structures. As described above, sufficient heat needs to be generated in order to blow a fuse. Having a fuse blown near a device region could alter performance of devices in that region of an integrated circuit.

Figure 3A:
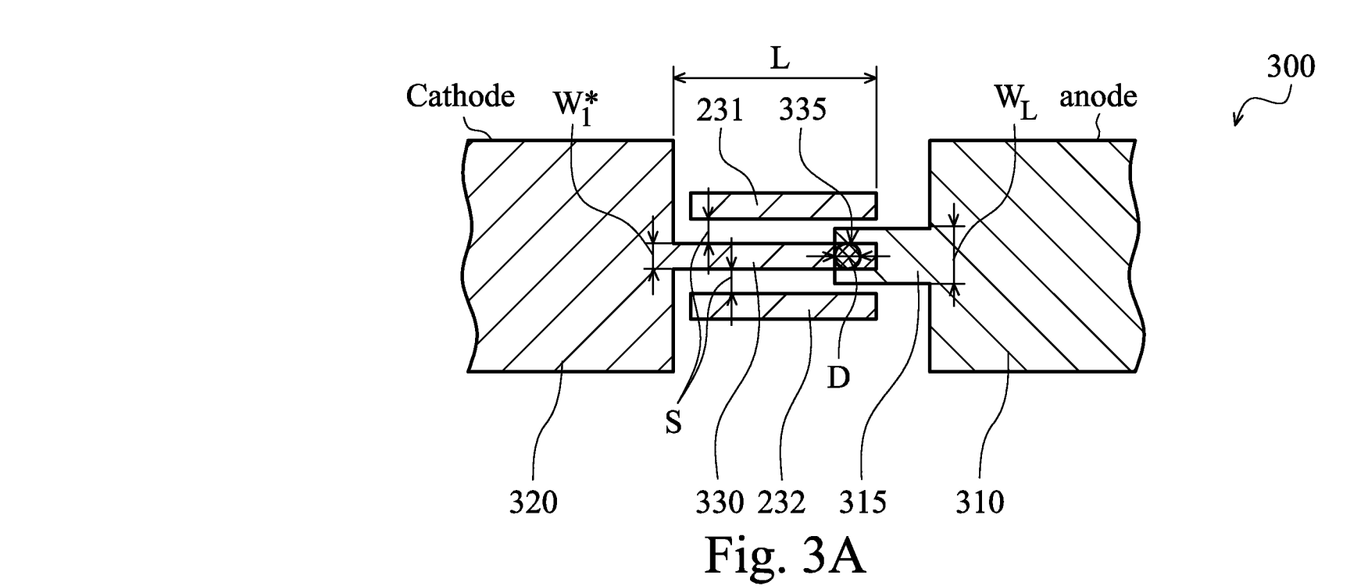
FIG. 3A is a top view of a metal-via fuse, in accordance with some embodiments.

FIG. 3A is a top view of a metal-via fuse 300, in accordance with some embodiments. Metal-via fuse 300 includes a metal fuse link 330 formed at a metal level ($M_N$) with the one end of metal fuse link 330 connected to a cathode 320 (wide metal area) at the same metal level ($M_N$) as the metal fuse link 330. Metal fuse link 330 is connected to a metal line 315 at a higher metal level ($M_{N+1}$) than the metal fuse link 330 through a via plug 335. Metal line 315 is wider than metal fuse link 330. A width of metal line 315 is $W_L$ and a width of the metal fuse link 330 is $W_1^*$. A length of fuse link 330 is L. The metal line 315 is connected to an anode 310 (wide metal area) by metal line 315. A diameter D of the via plug 335 is about the same as the width $W_1^*$ of fuse link 330, in some embodiments. In some other embodiments, the diameter D of via plug 335 is smaller than the width $W_1^*$ of fuse link 330. In some embodiments, the diameter D of the via plug 335 is in a range from about 0.01 μm to about 0.08 μm. In some embodiments, there are two dummy metal lines, 231 and 232, placed one on each side of fuse link 330, as shown in FIG. 3A. The function of dummy metal lines, 231 and 232, have been described above. A space between the dummy metal lines, 231 and 232, and the fuse link 330 is labeled as S. In some embodiments, the width $W_1^*$ is in a range from about 0.01 μm to about 0.08 μm. In some embodiments, the length L of fuse link 330 is in a range from about 0.3 μm to about 2.5 μm.

Figure 3B:
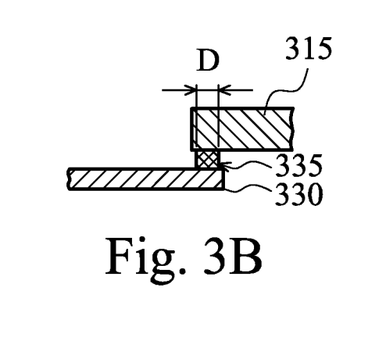
FIG. 3B is a cross-sectional view of the fuse link of metal-via fuse of FIG. 3A, in accordance with some embodiments.

FIG. 3B is a cross-sectional view of fuse link 330 near via plug 335, in accordance with some embodiments. FIG. 3B shows that metal line 315 is above via plug 335 and fuse link 330 is below via plug 335. Due to the narrow diameter D of via plug 335 and the insulation of via plug 335 by surrounding dielectric material(s), the resistivity of the metal-via fuse is higher than metal-fuse with the same metal width. In some embodiments, the resistivity of metal-via fuse is in a range from about 30 ohms to about 80 ohms, in accordance with some embodiments. In contrast, a metal-fuse with the same metal width as the fuse link 330 has a resistance in a range from about 10 ohms to about 50 ohms. In some embodiments, the resistivity of metal-via fuse is in a range from about 20 ohms to about 80 ohms.

Figure 3C:
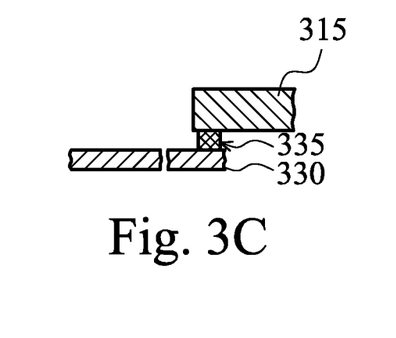
FIG. 3C is a cross-sectional view of the fuse link of FIG. 3B after the fuse link is blown, in accordance with some embodiments.
Figure 3D:
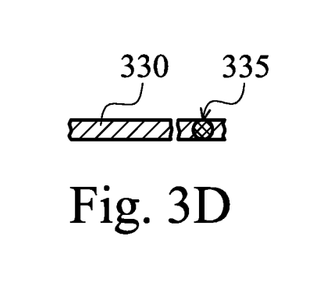
FIG. 3D is a top view of a blown fuse link of FIG. 3C, in accordance with some embodiments.

Heat from via plug 335 (with higher temperature) increases a temperature of fuse link 330 near the via plug. Thermal simulation shows that a temperature of via plug 335 is at about 1714° C. (the highest temperature), while the temperature of fuse link 330 away from via plug 335 is at about 775° C. to 963° C. when the programming voltage is at about 0.78V. The thermal simulation tool used is Ansys thermal simulation tool, made by Ansys Inc. of Canonsburg, Pa. As a result, fuse link 330 near via plug 335 would melt and separate after the voltage, $V_{PGM}$, is applied. FIG. 3C shows that the fuse link 330 of metal-via fuse 300 is broken near via plug 335, in accordance with some embodiments. FIG. 3D shows the top view of blown fuse link 330, in accordance with some embodiments. FIG. 3D shows that the fuse link 330 becomes discontinuous after the fuse is blown.

Figure 3E:
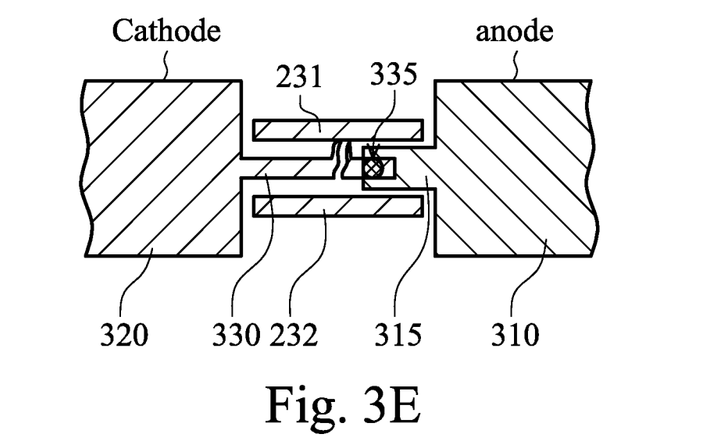
FIG. 3E is a top view of a blown fuse link shorted to a dummy metal line, in accordance with some embodiments.

As described above in FIG. 3A, there are two dummy metal lines, 231 and 232, one on each side of fuse link 330. Dummy metal lines 231 and 232 are next to fuse link 330 to assist in the accurate patterning of fuse link 330. FIG. 3E shows that the presence of the dummy metal lines makes the disconnection of blown fuse link 330 incomplete, in accordance with some embodiments. When metal fuse link 330 is blown, the melted metal is pushed aside. FIG. 3E shows that a portion of the displaced metal is blocked by dummy metal line 231 and pushed back towards the metal fuse link 330. As a result, the fuse link 330 remains conductive with the conductive path formed with the displaced metal and dummy metal line 231, as shown in FIG. 3E. Blowing a fuse of an OTP memory cell should be precise and consistent. Having one or more dummy metal lines nearby could make fuse blowing (or programming) inconsistent, if the dummy metal lines are too close.

Figure 3F:
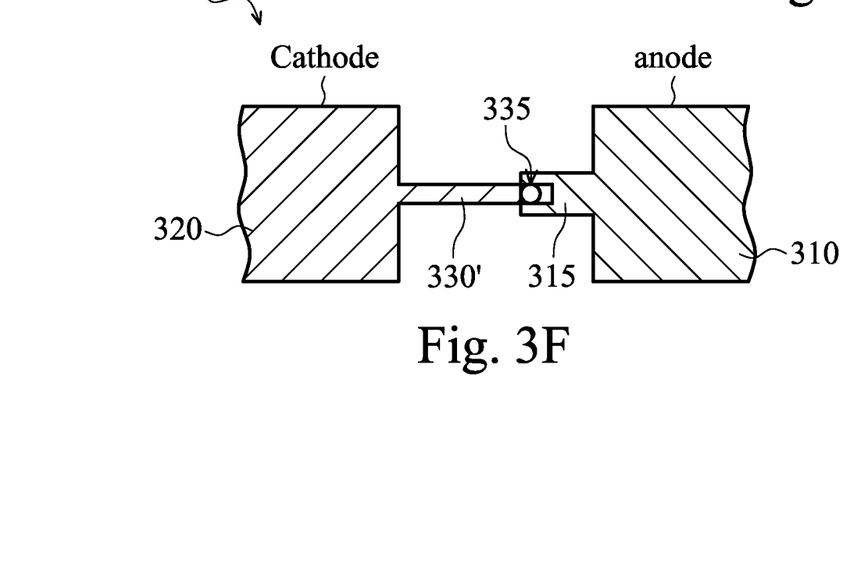
FIG. 3F is a top view of a metal-via fuse without dummy metal lines, in accordance with some embodiments.

FIG. 3F shows a metal-via fuse 300' without dummy metal lines next to fuse link 330', in accordance with some embodiments. Without dummy metal lines next to fuse link 330', the fuse-link 330' can be blown more consistently. Fuse link 330' can be printed by using optical proximity correction (OPC). OPC can be used to correct proximity effects and depth of focus (DOF) problems by adding scattering bars and anti-scattering bars near the edges of opaque and clear features, respectively, on a photomask. Scattering bars are added to make isolated and semi-isolated features behave more like an area of dense line features during a lithography process. By using OPC, fuse link 330' can be printed properly. If there are metal lines near fuse link 330, the space S between the fuse link 330 and dummy metal lines is sufficiently large to avoid affecting the consistency of fuse blowing. In some embodiments, the space S is in a range from about larger than about 0.1 μm.

Figure 3G:
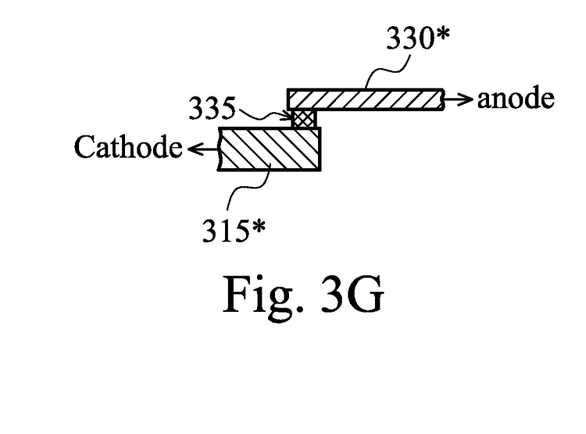
FIG. 3G is a top view of a metal-via fuse without dummy metal lines, in accordance with some other embodiments.

The metal-via fuse 300 and 300' in FIGS. 3A-3F include fuse link 330 and 330' at a metal level lower than the via plug 335. In some embodiments, a fuse link 330* of metal-via fuse is at a metal level higher than via plug 335 as shown in FIG. 3G, in accordance with some embodiments.

Figure 4A:
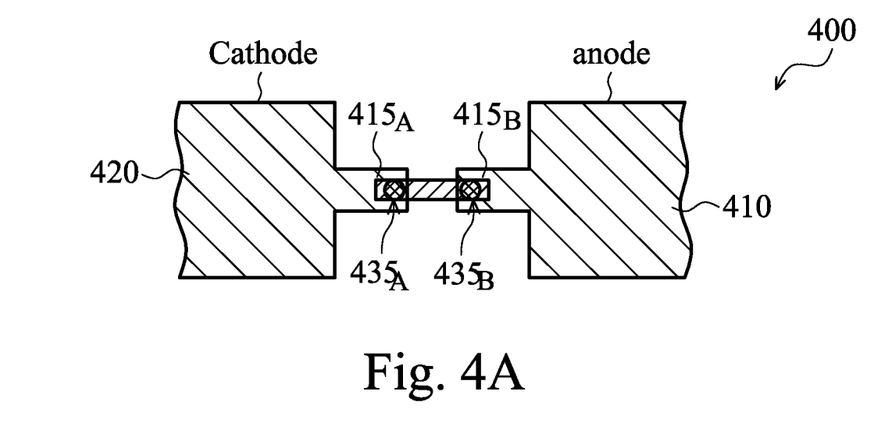
FIG. 4A is a top view of a metal-via fuse, in accordance with some embodiments.
Figure 4B:
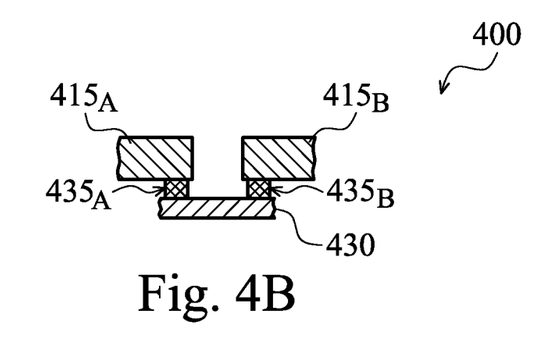
FIG. 4B is a cross-sectional view of a metal-via fuse of FIG. 4A, in accordance with some embodiments.
Figure 4C:
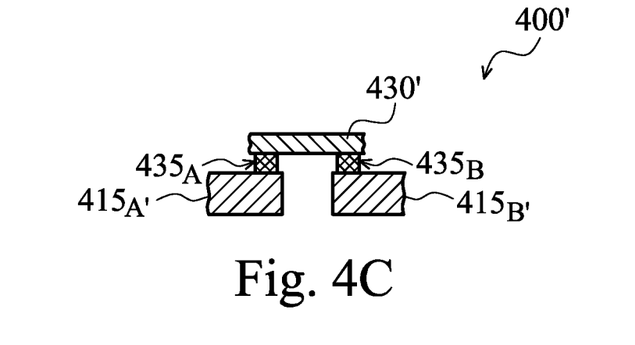
FIG. 4C is a cross-sectional view of a metal-vial fuse, in accordance with some embodiments.

The metal-via fuse 300, 300', and 300* described above involve fuse link 330, 330', and 330*, respectively, connected to a single via plug 335. In some embodiments, the fuse link of a metal-via fuse is connected to two via plugs. FIG. 4A shows a fuse link 440 of metal-via fuse 400 is connected to via plugs $435_A$ and $435_B$, in accordance with some embodiments. The cathode 420 and anode 410 are on a metal level higher than fuse link 430. Via plugs $435_A$ and $435_B$ are at higher temperatures than an average temperature of fuse link 430 under fuse programming. Excess heat from via plugs $435_A$ and $435_B$ is conducted to fuse link 440 to increase a temperature of the fuse link and to blow the fuse link 440. The fuse link 430 in FIG. 4A is at a metal level lower than via plugs $435_A$ and $435_B$. FIG. 4B is a cross-sectional view of fuse link 440 of FIG. 4A, in accordance with some embodiments. In some embodiments, a fuse link 430' of a metal-via link 400' is at a metal level higher than the via plugs, $435_A$ and $435_B$, connected to the fuse link 430', as shown in FIG. 4C. In some other embodiments, there are dummy metal lines, similar to dummy metal lines 231 and 232, next to the fuse links 430 and 430'.

Figure 5A:
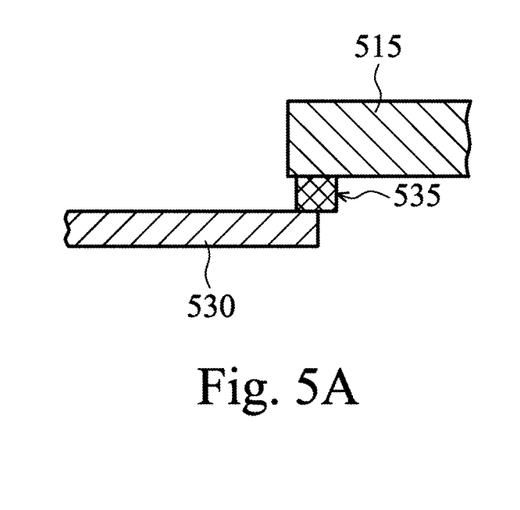
FIG. 5A is a cross-sectional view of a via plug of a metal-via fuse partially landed on a metal fuse line, in accordance with some embodiments.
Figure 5B:
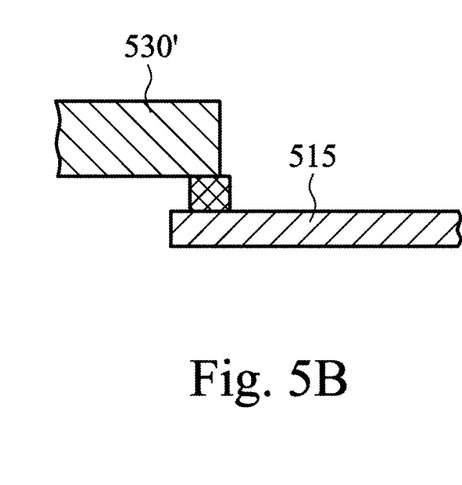
FIG. 5B is a cross-sectional view of a via plug of a metal-via fuse partially covered by a metal fuse line, in accordance with some embodiments.

The via plugs, such as via plugs 335, $435_A$ and $435_B$ of metal-via fuses described above are fully landed on the lower-level metal lines and fully covered by the upper-level metal lines. In some embodiments, a via plug of a metal-via fuse may be partially covered by upper-level metal line and/or partially landed on a lower-level metal line. FIG. 5A shows a via plug 535 partially landed on a metal fuse line 530, in accordance with some embodiments. Due to the partial landing of the via plug 535, a resistivity of metal fuse line 530 near the via plug 535 is increased, which would assist the blowing of the metal fuse line. FIG. 5B shows the via plug 535 being partially covered by a metal fuse line 530', in accordance with some embodiments.

Figure 6:
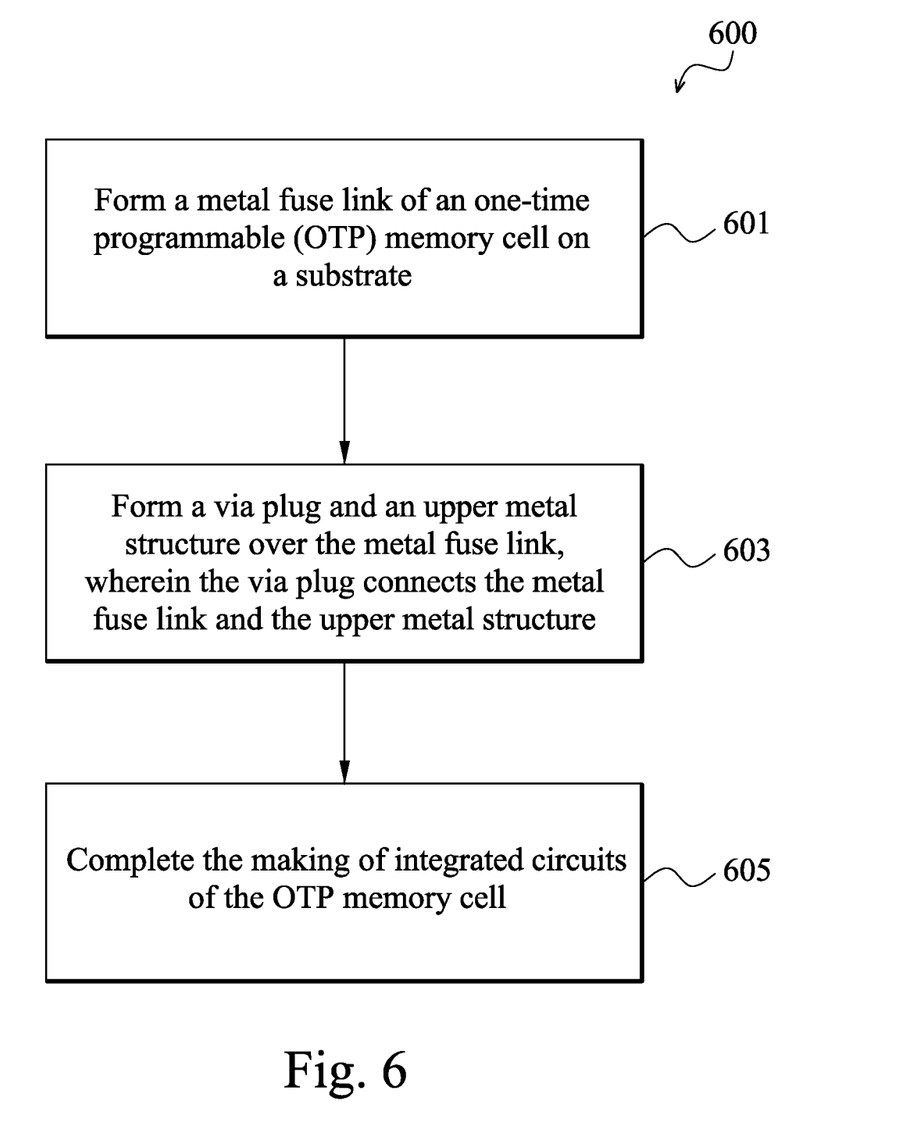
FIG. 6 is a flow chart of a process flow of forming a one-time programming (OTP) memory cell, in accordance with some embodiments.

FIG. 6 is a flow chart of a process flow 600 of making a metal-via fuse of an OTP memory cell, in accordance with some embodiments. At operation 601, a metal fuse link is formed on a substrate. The substrate has already formed device regions and structures related to the OTP memory cell and other devices. The substrate also has interconnect structures formed to connect with the device regions and structures. The metal fuse link is embedded in a dielectric layer. In some embodiments, the dielectric layer is made of a low dielectric-constant (low-k) material. The dielectric constant (or k value) of the dielectric layer is less than about 3.5 in some embodiments. In some embodiments, the k value of the dielectric layer is less than about 2.5. the metal fuse link may be formed by a damascene process or a dual damascene process. An exemplary metal fuse link is described above as fuse link 330, 330', 330*, 430, or 430'. The metal fuse link is at a level equal to or greater than second metal level (M2), in accordance with some embodiments. In some other embodiments, the metal fuse link is at the first metal level (M1). In some embodiments, the metal fuse link is connected to a cathode at one end. The cathode has a wider width than the metal fuse link. In some embodiments, the metal fuse link is a metal line with two ends.

Afterwards at operation 603, a via plug and an upper metal structure are formed over an end of the metal fuse link, in accordance with some embodiments. The via plug connects the metal fuse link and the upper metal layer. The upper metal structure includes a metal line connected to a wide metal area, which is an anode for the metal-via fuse, in accordance with some embodiments. The via plug and the upper metal structure are embedded in a dielectric layer(s). In some embodiments, the dielectric layer(s) is made of a low-k material. The formation of the via plug and the upper metal structure involves depositing the dielectric layer and patterning of the dielectric layer to create the openings of the via plug and the upper metal structure. The via opening and the opening for upper metal structure are then filled with a conductive material, such as copper, tungsten, or aluminum. Prior to filling the via opening and the opening for the upper metal structure with the conductive material, a liner layer(s) may be deposited to line the via opening. The liner layer could act as an adhesion-promoting layer and/or as a diffusion barrier, such as a diffusion barrier for copper. Exemplary liner materials may include, but are not limited to, Ti, TiN, or a combination thereof. For example, the liner layer may include dual layers with a TiN layer deposited over a Ti layer to form a Ti/TiN layer. The process used to form the via plug the and upper metal structure is called a dual damascene process. In some embodiments, the via plug is formed before forming the upper metal layer. In this instance, the via plug and upper metal structure are formed by a single damascene process.

In some embodiments, two via plugs are formed on the metal fuse link with one on each end of the metal fuse link, such as via plugs $415_A$ and $415_B$ of FIGS. 4A and 4B, in accordance with some embodiments. The two via plugs are connected to the metal fuse link and to two upper metal structures as shown in FIGS. 4A and 4B, in accordance with some embodiments. In some embodiments, a via plug of a metal-via fuse is partially landed on a metal line or partially covered by a metal line.

Afterwards, additional processing is performed to complete the making of the integrated circuits of the OTP memory cell with the metal-via fuse at operation 605. The additional processing operations may also include forming interconnect and packaging of integrated circuit on the substrate that includes the non-salicided polysilicon fuse.

The process flow 600 described above describes process sequence(s) involved in forming a metal-via fuse with the fuse link at a lower metal level compared to the via plug(s). As mentioned above, the fuse link is at a higher metal level than the via plug(s) in some embodiments. For such structures, the order of forming via plug(s), the fuse link and the metal structure(s) connected to the via plug to form the metal-via fuse would need to be altered.

The embodiments of methods and structures disclosed herein provide mechanisms of forming and programming a metal-via fuse. The metal-via fuse and a programming transistor form a one-time programmable (OTP) memory cell. The metal-via fuse has a high resistance and can be programmed at a larger voltage window by enabling programming at a lower voltage, which expands the programming window.

In some embodiments, a metal-via fuse is provided. The metal-via fuse includes an anode at a first metal layer, and a cathode made of a second metal layer. The metal-via fuse also includes a fuse link made of the second metal layer, and the fuse link is connected to the cathode. The metal-via fuse further includes a metal line connected to the anode, and the metal line is made of the first metal layer. In addition, the metal-via fuse includes a via plug disposed between the fuse link and the metal line; wherein the via plug contacts the fuse link and the metal line.

In some other embodiments, a metal-via fuse is provided. The metal-via fuse includes an anode made of a first metal layer, and the anode includes a first metal line at a first end. The metal-via fuse also includes a cathode made of the first metal layer, and the cathode includes a second metal line at a second end. The metal-via fuse further includes a fuse link made of a second metal layer, and the link has a third end and a fourth end. The third end and the fourth are on opposite sides of the fuse link. In addition, the metal-via fuse includes two via plugs, and one of the two via plug is disposed between the third end of the fuse link and the first end of the anode. The other via plug is disposed between the fourth end of the fuse link and the second end of the cathode.

In yet some other embodiments, a method of forming a metal-via fuse is provided. The method includes forming a metal fuse link on a substrate, and the metal fuse link is an elongated metal line. The method also includes forming a via plug contacting one end of the metal fuse link, and forming a metal structure on a different metal level from the metal fuse link. The metal structure contacts the via plug, and the metal structure includes a first large metal region. The first large metal region is an anode of the metal-via fuse.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A metal-via fuse, comprising:
an anode at a first metal layer;
a cathode made of a second metal layer;
a fuse link made of the second metal layer, wherein the fuse link is connected to the cathode;
a metal line connected to the anode, wherein the metal line is made of the first metal layer; and
a via plug disposed between the fuse link and the metal line; wherein a first end of the via plug contacts the fuse link and a second end of the via plug contacts the metal line, and less than an entirety of the first end of the via plug is landed on the fuse link.

2. The metal-via fuse of claim 1, wherein the metal-via fuse has a resistivity in a range from about 20 ohms to about 80 ohms.

3. The metal-via fuse of claim 1, wherein the fuse link has a width in a range from about 0.01 µm to about 0.08 µm.

4. The metal-via fuse of claim 1, wherein the fuse link has a length in a range from about 0.3 µm to about 2.5 µm.

5. The metal-via fuse of claim 1, wherein the via plug has a diameter in a range from about 0.01 µm to about 0.08 µm.

6. The metal-via fuse of claim 1, wherein the second metal layer is above the first metal layer.

7. The metal-via fuse of claim 1, wherein the first metal layer is above the second metal layer.

8. The metal-via fuse of claim 1, wherein the metal-via fuse is free of dummy metal lines adjacent to the fuse link.

9. The metal-via fuse of claim 1, further comprising a dummy metal line adjacent the fuse link wherein a distance between the fuse link and the dummy metal line is at least about 0.1 µm.

10. The metal-via fuse of claim 1, wherein the anode is connected to a controlling transistor, wherein the controlling transistor is coupled to a power supply for controlling the supplying of power by the power supply to the fuse link.

11. The metal-via fuse of claim 1, wherein the cathode is connected to a drain of a programming transistor for controlling programming of the metal-via fuse.

12. The metal-via fuse of claim 11, wherein the metal-via fuse is configured to facilitate a current of equal to or greater than about 10 mA if the programming transistor is turned on.

13. The metal-via fuse link of claim 1, wherein the metal line has a constant width.

14. The metal-via fuse of claim 11, wherein a programming voltage at a source of the programming transistor is in a range from about 1.2V to about 2.4V.

15. A metal-via fuse, comprising:
an anode made of a first metal layer, wherein the anode includes a first metal line at an end thereof;
a cathode made of the first metal layer, wherein the cathode includes a second metal line at an end thereof;

a fuse link made of a second metal layer, wherein the link has a first end and a second end, wherein the first end and the second are on opposite sides of the fuse link; and two via plugs, wherein one of the two via plugs is disposed between the first end of the fuse link and the end of the anode, and wherein the other via plug is disposed between the second end of the fuse link and the end of the cathode, and less than an entirety of at least one via plug of the two via plugs is landed on the fuse link.

16. The metal-via fuse of claim 15, wherein the second metal layer is closer to a device region than the two via plugs.

17. A method of forming a metal-via fuse, comprising:

forming a metal fuse link on a substrate, wherein the metal fuse link is an elongated metal line;

forming a via plug contacting one end of the metal fuse link, wherein less than an entirety of an end of the via plug is landed on the metal fuse link; and forming a metal structure on a different metal level from the metal fuse link, and wherein the metal structure contacts the via plug, and wherein the metal structure includes a first large metal region, wherein the first large metal region is an anode of the metal-via fuse.

18. The method of claim 17, wherein metal fuse link is connected to a second large metal region on an end opposite from the via plug, wherein the second large metal region is a cathode of the metal-via fuse.

19. The method of claim 17, further comprising:

forming another via plug while forming the via plug; and forming another metal structure while forming the metal structure, wherein the other via plug contacts the other end of the metal fuse link and also the other metal structure, wherein the other metal structure includes a second large metal region, wherein the second large metal region is a cathode of the metal-via fuse.

20. The method of claim 17, wherein metal fuse link has a width in a range from about 0.01 μm to about 0.08 μm, and wherein a diameter of the via plug is smaller than the width of the metal fuse link.

* * * * *